(12) United States Patent
Adams et al.

(10) Patent No.: US 6,839,507 B2
(45) Date of Patent: Jan. 4, 2005

(54) BLACK REFLECTOR PLATE

(75) Inventors: Bruce Adams, Portland, OR (US); Aaron Hunter, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 116 days.

(21) Appl. No.: 10/267,053

(22) Filed: Oct. 7, 2002

(65) Prior Publication Data

US 2004/0065657 A1 Apr. 8, 2004

(51) Int. Cl.$^7$ ................................................ A21B 2/00
(52) U.S. Cl. .................. 392/416; 392/416; 219/390; 219/405; 219/411; 374/126; 374/131; 374/120; 374/128; 374/161
(58) Field of Search .................. 374/126, 120–121, 374/130–131, 128, 161; 219/390, 405, 411; 392/416, 418; 118/724, 725, 50.1

(56) References Cited

U.S. PATENT DOCUMENTS

| | | | |
|---|---|---|---|
| 4,421,987 A | * 12/1983 | Herold | 250/492.1 |
| 5,155,336 A | 10/1992 | Gronet et al. | 219/411 |
| 5,206,871 A | 4/1993 | Deppe et al. | 372/45 |
| 5,635,409 A | 6/1997 | Moslehi | 438/7 |
| 5,660,472 A | 8/1997 | Peuse et al. | 374/128 |
| 5,716,133 A | 2/1998 | Hosokawa et al. | 374/121 |
| 5,993,059 A | 11/1999 | O'Neill et al. | 374/126 |
| 6,007,241 A | 12/1999 | Yam et al. | 374/131 |
| 6,027,244 A | * 2/2000 | Champetier et al. | 374/130 |
| 6,054,687 A | * 4/2000 | Conner et al. | 219/405 |
| 6,124,912 A | 9/2000 | Moore | 349/113 |
| 6,127,658 A | 10/2000 | Kohav | 219/390 |
| 6,142,663 A | 11/2000 | Takasuka | 374/131 |
| 6,160,242 A | 12/2000 | Guardado | 219/390 |
| 6,174,080 B1 | 1/2001 | Jennings | 374/131 |
| 6,183,130 B1 | 2/2001 | Adams et al. | 374/131 |
| 6,215,106 B1 | 4/2001 | Boas et al. | 219/390 |
| 6,641,302 B2 | * 11/2003 | Li et al. | 374/130 |

* cited by examiner

Primary Examiner—Shawntina Fuqua
(74) Attorney, Agent, or Firm—Charles S. Guenzer, Esq.

(57) ABSTRACT

In a system for thermal processing of a semiconductor substrate, an RTP system employs a reflector plate which is highly reflective of radiation in a target wavelength range, and less reflective of radiation outside that target wavelength range. In one embodiment, the reflector plate has a highly reflective portion overlying a less reflective portion, wherein the highly reflective portion is highly reflective of radiation in the target wavelength range. As radiation emitted by the substrate is received on the reflector, the radiation in the target wavelength range is reflected, thereby facilitating measurement of the substrate temperature by the pyrometer(s), while radiation outside the target wavelength range is absorbed, thereby facilitating cooling of the substrate.

27 Claims, 5 Drawing Sheets

BLACK REFLECTOR PLATE

BACKGROUND OF THE INVENTION

This invention relates to apparatus and methods of thermally processing a material such as a semiconductor substrate.

A number of applications involve thermal processing of semiconductor and other materials which require precise measurement and control of the temperature of the material. For instance, processing of a semiconductor substrate requires precise measurement and control of the temperature over a wide range of temperatures. One example of such processing is rapid thermal processing (RTP), which is used for a number of fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). In the particular application of CMOS gate dielectric formation by RTO or RTN, thickness, growth temperature, and uniformity of the gate dielectrics are parameters that influence the overall device performance and fabrication yield. At least some of these processes require variations in temperature across the substrate of less than a few degrees Celsius.

As used herein, the term substrate broadly refers to any object that is being processed in a thermal processing chamber. Such substrates may include, for example, semiconductor wafers, flat panel displays, glass plates or disks, and plastic workpieces.

One element for minimizing variations in substrate temperature during processing is precise measurement of the temperature of the wafer. One method for precisely measuring substrate temperature is optical pyrometry. In that method, the radiation emitted by the substrate is measured to determine the substrate's temperature. The relationship between spectral emitted intensity and the temperature of the emitting object depends on the spectral emissivity of the substrate and the ideal blackbody radiation-temperature relationship, given by Planck's Distribution. Using known approximations, including an approximation known as Wein's Displacement Law, the temperature can be approximated from the wavelength of light having the peak emission or it can be determined using the Stefan-Boltzmann Law from the spectral emitted intensity.

However, optical pyrometry suffers from limitations due to the inability to accurately measure the emissivity of a substrate. Moreover, even if the emissivity of a substrate is known at a given temperature, it changes as a function of temperature. These changes are difficult to measure and therefore introduce an unknown error into the temperature measurements. Errors on the order of 10 degrees Celsius are not uncommon.

The emissivity of a substrate can be affected by many factors, including the characteristics of the wafer itself, such as the wafer's temperature, surface roughness, doping level of various impurities, and material composition and thickness of surface layers. Other factors include the characteristics of the process chamber and the process history of the wafer.

Various techniques have been employed to reduce the effects of changes in emissivity. One such technique involves placing a thermal reflecting body near the back surface of the target substrate so that thermal radiation from the substrate is reflected back to the substrate. The reflector may be said to form a reflecting cavity with the substrate. A light pipe may be inserted through the reflector into the cavity to sample radiation from the reflecting cavity and deliver the sample light to a pyrometer. U.S. Pat. No. 5,660,472, which is incorporated herein by reference, describes such techniques.

If the reflector were an ideal reflector, all of the thermal radiation emitted from the substrate would be reflected back onto the substrate, so that the reflecting cavity would act like an ideal black body. In other words, the intensity of the thermal radiation within the reflective cavity would not be a function of the emissivity of the surface of the substrate. The reflective cavity would increase the effective emissivity of the substrate to a value equal to one. Because the reflector is actually less than perfect, however, the effective emissivity of the substrate is higher than the emissivity of the substrate but less than one. Nevertheless, some error is necessarily introduced because the reflector is not an ideal reflector, and so the light received by the pyrometer is not perfectly representative of the light emitted by the substrate.

Another important element in thermal processing of substrates is the ability to control the temperature of the substrate. Generally, the substrate must be rapidly heated and cooled within very precise parameters over a wide range of temperature. A number of techniques are known for providing rapid and controllable heating and cooling. For instance, it is known to change the rate at which heat is transferred between the substrate and a heat source or thermal reservoir during processing of the substrate by applying different gases to the processing chamber. For instance, the rate at which the substrate is heated can be significantly increased by providing a purge gas with a relatively low thermal conductivity (e.g., nitrogen, argon, xenon, or a combination of two or more of these gases) in the reflective cavity during heating of the substrate. Likewise, the rate at which the substrate is cooled can be significantly increased by providing a purge gas with a relatively high thermal conductivity (e.g., helium, hydrogen, or a combination of those gases) between the substrate and a thermal reservoir during the cool-down phase of the processing. U.S. Pat. No. 6,215,106B1, which is incorporated herein by reference, describes such techniques. These methods, however, require careful control of the gases, which can complicate and/or prolong the process.

SUMMARY

The present invention is generally directed to a method and apparatus for thermally processing a substrate. Generally, a reflector has a surface facing the substrate that is reflective of radiation in a target wavelength range and absorptive of radiation outside that range. The target wavelength range typically represents the wavelength of radiation emitted by the substrate when the substrate is at a target temperature. One or more pyrometers are positioned on the reflector to measure the radiation. By reflecting radiation in the target wavelength range, the reflector enhances the accuracy of the temperature measurement through the pyrometers. By absorbing radiation outside the target wavelength range, the reflector facilitates cooling of the substrate.

The invention has particular use in a thermal processing system in which one or more pyrometers are employed to measure the substrate temperature. Specifically, each pyrometer measures the intensity of radiation emitted by the substrate. The configuration of the pyrometers is such that, using the Stefan-Boltzmann Law, the temperature of the substrate can be calculated from the intensity of radiation received by the pyrometer. In some embodiments, one or more additional pyrometers are employed to provide a more accurate temperature determination.

The reflector of the present invention is tailored to this pyrometry system. The determination of the temperature from the intensity of radiation emitted by the substrate preferably requires highly reflective conditions in the area around the pyrometer(s) with respect to radiation in the target wavelength range of radiation, i.e., the wavelength range of radiation emitted by the substrate when the substrate is within the target temperature range. The surface of the reflector, therefore, is highly reflective of radiation in the target temperature range.

Cooling of the substrate, however, is facilitated by absorption by the reflector of radiation emitted by the substrate, as opposed to reflection of the radiation back to the substrate. The reflector, therefore, is far less absorptive of radiation outside the target wavelength range. In a preferred embodiment, the reflector comprises a highly reflective portion overlying a less reflective portion. The highly reflective portion reflects radiation in the target wavelength range, facilitating the accurate measurement of temperature through the pyrometers. Radiation outside the target wavelength range, however, passes through the highly reflective portion and is absorbed by the less reflective portion of the reflector. This absorption helps to cool the substrate during the cooling phase of the processing.

Preferably, a multilayer structure is positioned on the reflector surface. One layer is an absorptive layer having reduced reflectivity over a broad range of wavelengths. Overlying the absorptive layer are one or more reflective layers. These more reflective layers are highly reflective of radiation in the target wavelength range, and are at least partially transparent to radiation outside the target wavelength range. Radiation inside the target wavelength range is reflected by the more reflective layers, enhancing temperature measurement through the pyrometers. Radiation outside the target wavelength range passes through the more reflective layers and is absorbed by the less reflective layers, facilitating cooling of the substrate.

For a better understanding of these and other aspects of the present invention, reference should be made to the following detailed description taken in conjunction with the accompanying drawings.

BRIEF DESCRIPTION OF THE DRAWINGS

In the drawings, which are not necessarily to scale.

DETAILED DESCRIPTION

The present invention is generally directed to an RTP system employing a reflector plate which is highly reflective of radiation in a target wavelength range, and less reflective of radiation outside that target wavelength range. In one embodiment, the reflector plate has a highly reflective portion overlying a less reflective portion, wherein the highly reflective portion is highly reflective of radiation in the target wavelength range. As radiation emitted by the substrate is received on the reflector, the radiation in the target wavelength range is reflected, thereby facilitating measurement of the substrate temperature by the pyrometer(s), while radiation outside the target wavelength range is absorbed, thereby facilitating cooling of the substrate.

The RTP System

Figure 1:
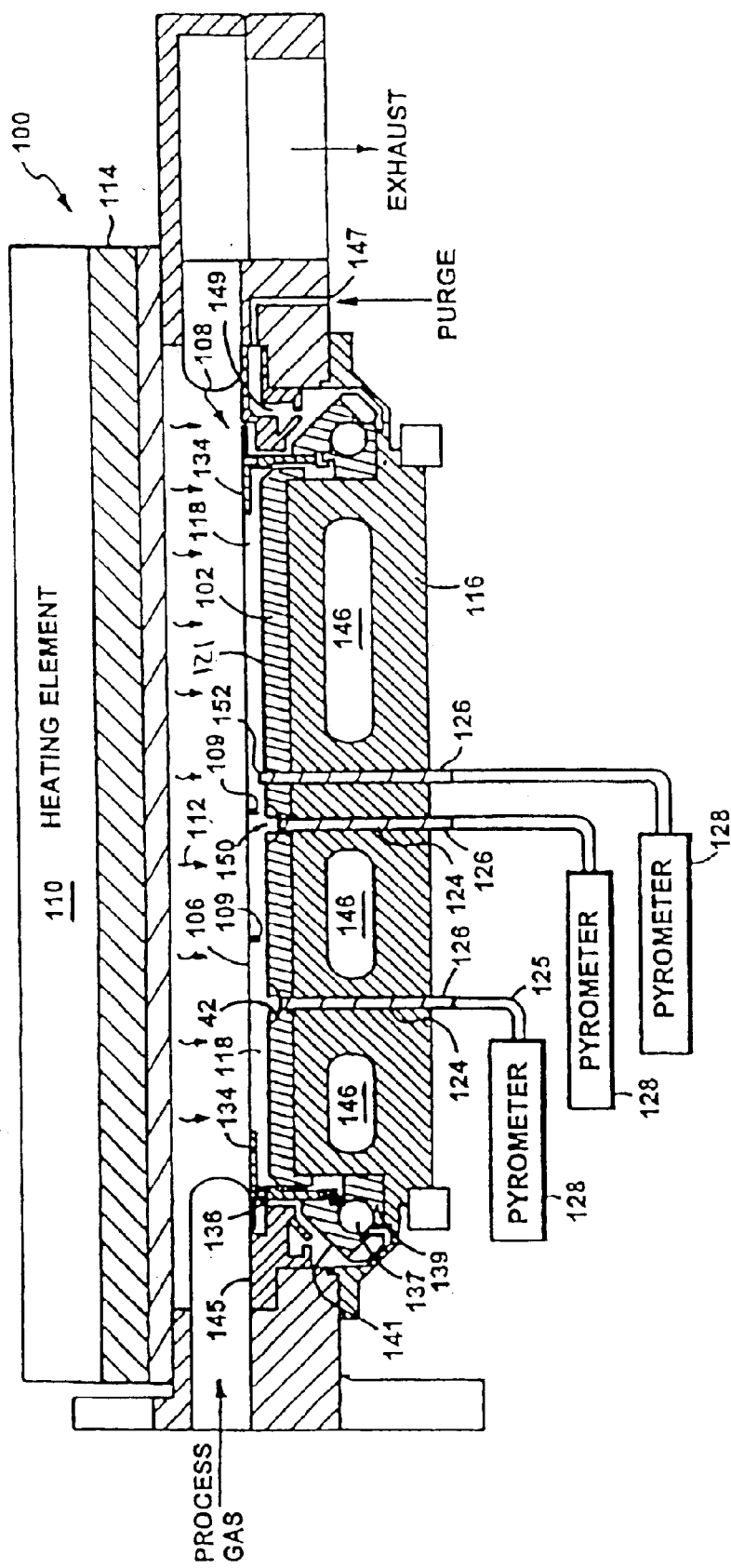
FIG. 1 is a schematic cross-sectional side view of an apparatus for measuring substrate temperature in which a reflector is positioned near a substrate, in accordance with one aspect of the present invention.

An RTP system in accordance with one embodiment of the present invention is shown in FIG. 1. The RTP system includes a processing chamber 100 for processing a substrate 106. In one embodiment of the present invention, the substrate 106 is a disk-shaped, eight inch (200 mm) diameter silicon substrate. In another, it is a twelve inch (300 mm) diameter silicon substrate. The substrate 106 is mounted inside the chamber 100 on a substrate support structure 108 and is heated by a heating element 110 positioned directly above the substrate. The heating element 110 generates radiation 112 which enters the processing chamber 100 through a water-cooled quartz window assembly 114 which is approximately one inch (25 mm) above the substrate. Beneath the substrate is a reflector 102 which is mounted on a water-cooled, stainless steel base 116. The underside of the substrate 106 and a top surface 121 of the reflector 102 form a reflecting cavity 118 for enhancing the effective emissivity of the substrate, as will be discussed in more detail below.

In the embodiment shown in FIG. 1, the separation between an eight inch substrate 106 and reflector 102 is less than approximately 0.3 inch (7.6 mm), thus forming a cavity which has a width-to-height ratio of more than about 27 (i.e., 200 mm wafer diameter divided by 7.6 mm separation). If the separation is made too large, there will be a decrease in the emissivity-enhancement effect attributable to the virtual blackbody cavity that is formed. On the other hand, if the separation is too small, then the thermal conduction from the substrate to the cooled reflector will increase unacceptably. This will impose an unacceptably large thermal load on the heated substrate since the main mechanism for heat loss to the reflecting plate will be conduction through the gas, the thermal loading will, of course, depend up the type of gas and the chamber pressure during processing. Other factors regarding this separation are described below.

The temperatures at localized regions 109 of substrate 106 are measured by one or more temperature probes 150 (only three of which are shown in FIG. 1). The temperature probes are preferably sapphire light pipes that pass through a conduit 124 that extends from the backside of base 116 through the top of reflector 102. Sapphire light pipes 126 are about 0.125 inch (3 mm) in diameter and conduits 124 are slightly larger to enable them to be easily inserted into the conduits. In one embodiment of the present invention, one temperature probe 150 may be used to make temperature measurements, while another temperature probe 152 may serve as a correction probe.

As indicated above, although only three measurement probes are shown in FIG. 1, the described embodiment may actually use any suitable number of such probes, for example, eight measurement probes distributed over the reflector so as to measure the temperature at different radii of the substrate. During thermal processing, support structure 108 is rotated at, preferably, about 90 RPM. Thus, each probe actually samples the temperature profile of a corresponding annular ring area on the substrate.

The support structure which rotates the substrate includes a support ring 134 which contacts the substrate around the substrate's outer perimeter, thereby leaving all of the underside of the substrate exposed except for a small annular region about the outer perimeter. In one embodiment, the annular region of the support ring 134 has a radial width of approximately one inch (25 mm). To minimize the thermal discontinuities that will occur at the edge of substrate 106 during processing, support ring 134 is made of the same, or similar, material as the substrate, e.g. silicon or silicon carbide. The support ring 134 rests on a rotatable tubular quartz cylinder 136 that is coated with silicon to render it opaque in the frequency range of the pyrometers. The silicon coating on the quartz cylinder acts as a baffle to block out radiation from external sources that might distort the intensity measurements. The bottom of the quartz cylinder is held by an annular upper bearing race 141 which rests on a plurality of ball bearings 137 that are, in turn, held within an stationary, annular, lower bearing race 139. The ball bearings 137 are made of steel and coated with silicon nitride to reduce particulate formation during operation. The upper bearing race 141 is magnetically-coupled to an actuator (not shown) which rotates the cylinder 136, support ring 134 and substrate 106 at about 90 RPM during thermal processing.

In this embodiment, the support ring 134 is designed to create a seal with the quartz cylinder 136. Extending from the bottom surface of the support ring 134 is a cylindrically shaped lip which has an outside diameter that is slightly smaller than the inside diameter of the quartz cylinder, so that it fits into the cylinder, as shown, and forms a light seal. On the inside region of the support ring, there is a shelf for supporting substrate 106. The shelf is a region around the inside circumference of the support ring that is lower than the rest of the support ring. A purge ring 145 that is fitted into the chamber body surrounds the quartz cylinder. The purge ring 145 has an internal annular cavity 149 which opens up to a region above upper bearing race 141. The internal cavity 149 is connected to a gas supply (not shown) through a passageway 147. During processing, a purge gas is flowed into the chamber through purge ring 145.

The support ring 134 has an outer radius that is larger than the radius of the quartz cylinder so that it extends out beyond the quartz cylinder. The annular extension of the support ring beyond cylinder 136, in cooperation with purge ring 145 located below it, functions as a baffle which prevents stray light from entering the reflecting cavity at the backside of the substrate. To further reduce the possibility of stray light reflecting into the reflecting cavity, support ring 134 and purge ring 145 may also be coated with a material that absorbs the radiation generated by heating element 110 (e.g., a black or grey material).

As indicated above, the light pipes 126 are preferably made of sapphire. Sapphire light pipes are generally preferred because they have relatively small scattering coefficients and they tend to have greater transverse light rejection, thus they provide greater measurement localization. However, the light pipes can be made of any appropriate heat-tolerant and corrosion-resistant material, e.g., quartz, that can transmit the sampled radiation to the pyrometer. Alternatively, the radiation sampling system could be an optical system that includes a small-radius objective lens mounted in reflector 102 and a system of mirrors and lenses which communicate radiation collected by the lens to the pyrometer. Such a scheme may be less expensive than sapphire light pipes if appropriate off-the-shelf optical elements can be found. Alternatively, light pipes can also be made from a tube with a highly polished reflective inner surface.

An example of a suitable heating element 110 is disclosed in U.S. Pat. No. 5,155,336. This heating element uses light pipes (not shown) to deliver highly collimated radiation from tungsten-halogen lamps to processing chamber 100. The lamps are divided into twelve zones which are located in a radially symmetrical manner. The zones can be individually adjusted to allow the radiative heating of different areas of substrate 106 to be controlled.

In the embodiment of FIG. 1, a base 116 includes a circulation circuit 146 through which coolant circulates, thereby cooling the reflector and the reflecting surface. Water which is typically at about room temperature (23° C.) is circulated through the base 116 to keep the temperature of the reflector well below that of the heated substrate. For example, the temperature of the reflector may be kept at 100° C. or less. It is important to cool the reflector during RTP to discourage any possible chemical activity that might occur on its surface. If the reflector is allowed to heat up, this will tend to increase surface oxidation which could seriously degrade the reflectivity of the reflecting portions of the reflector. Achieving an effective emissivity enhancement depends on having and maintaining a highly reflective surface on those reflective portions. In addition, as the reflector assembly heats up, it will become a source of radiation which will distort the sampled signal.

In some designs, it is desirable in a system for processing silicon substrates to use a pyrometer that detects long radiation wavelengths (e.g., wavelengths greater than about 3.5 to 4 microns). However, this approach is best suited for temperatures above 700° C. At room temperature, a silicon wafer is transparent to wavelengths of light longer than 1.0 microns. As the temperature of the substrate increases, the substrate becomes opaque to the longer wavelengths until, at about 700° C., the substrate becomes opaque to all wavelengths of interest. Thus, at temperatures below 700° C., a long wavelength sensitive pyrometer will be more apt to also detect light coming directly from the heat source. In short, the wavelength sampled by the pyrometer should vary with the process temperature. If the process temperature is substantially below 700° C., then the pyrometer should sample wavelengths shorter than 1.1 microns. If higher process temperatures are used, then longer wavelengths can be sampled.

In one design, particularly suitable for process temperatures between 900° C. and 1350° C., a solid-state pyrometer is used that is sensitive to radiation at wavelengths between 0.9 microns and 1.0 microns (e.g., a 900-LP-6.35C sensor combined with a 100-S8MS-B-8CV electronics box). In this temperature range, there is substantial amount of radiation produced in the wavelength range 0.9–1.0 microns providing high signal strengths and high signal-to-noise ratios.

The Reflector

Figure 2:
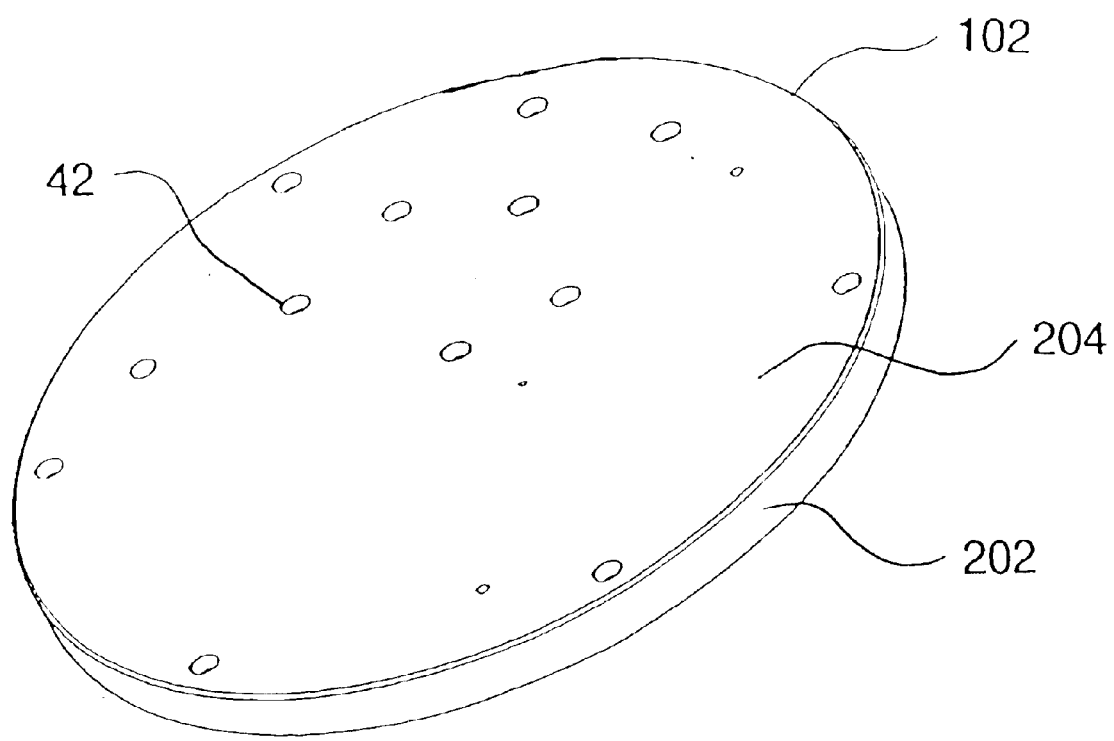
FIG. 2 is a perspective view of a reflector in accordance with one embodiment of the present invention.

As shown in FIG. 2, in accordance with one aspect of the invention, the reflector 102 comprises a body portion 202 having a surface 204 facing the substrate 106 during processing. As discussed below, the reflector surface 204 may contain one or more reflective cavities 42 in which light pipes (not shown in FIG. 2) are positioned.

The surface 204 of the reflector body 202 is configured to have a layer 121 that is highly reflective of radiation in a target wavelength range and less reflective of radiation outside the target wavelength range. In the preferred embodiments, one or more coatings or layers are provided on the reflector body surface 204 to achieve this selective reflectivity. In the embodiment shown in FIG. 3, a plurality of coatings are provided on the upper surface 204 of the reflector body. Preferably, these coatings provide high reflectivity for radiation in the target wavelength range, and include one or more interference layers 310 positioned over the reflector surface 204. In the preferred embodiment, the interference layers 310 comprises pairs of layers, each pair comprising a layer with a low index of refraction and a layer with a high index of refraction. Together, the interference layers comprise a structure that is highly reflective of radiation in the target wavelength range and less reflective of radiation outside the target wavelength range. The particular material, thickness, and other characteristics of the interference layers are selected based on a number of characteristics of the processing system, including the target wavelength range. Suitable interferences layers and/or coating will apparent to those of skill in the art, and may be obtain from, for example, Research Electro-Optics, inc. in Boulder, Colo.

In one embodiment, the highly reflective portion of the reflector 102 comprises a quarter-wave stack. The quarter-wave stack is made up of alternating dielectric layers which have different indices of refraction and have a thickness equal to ¼ of the wavelength to which the pyrometer is most sensitive (e.g., a thickness equal to ¼ of 950 nanometers).

Figure 3:
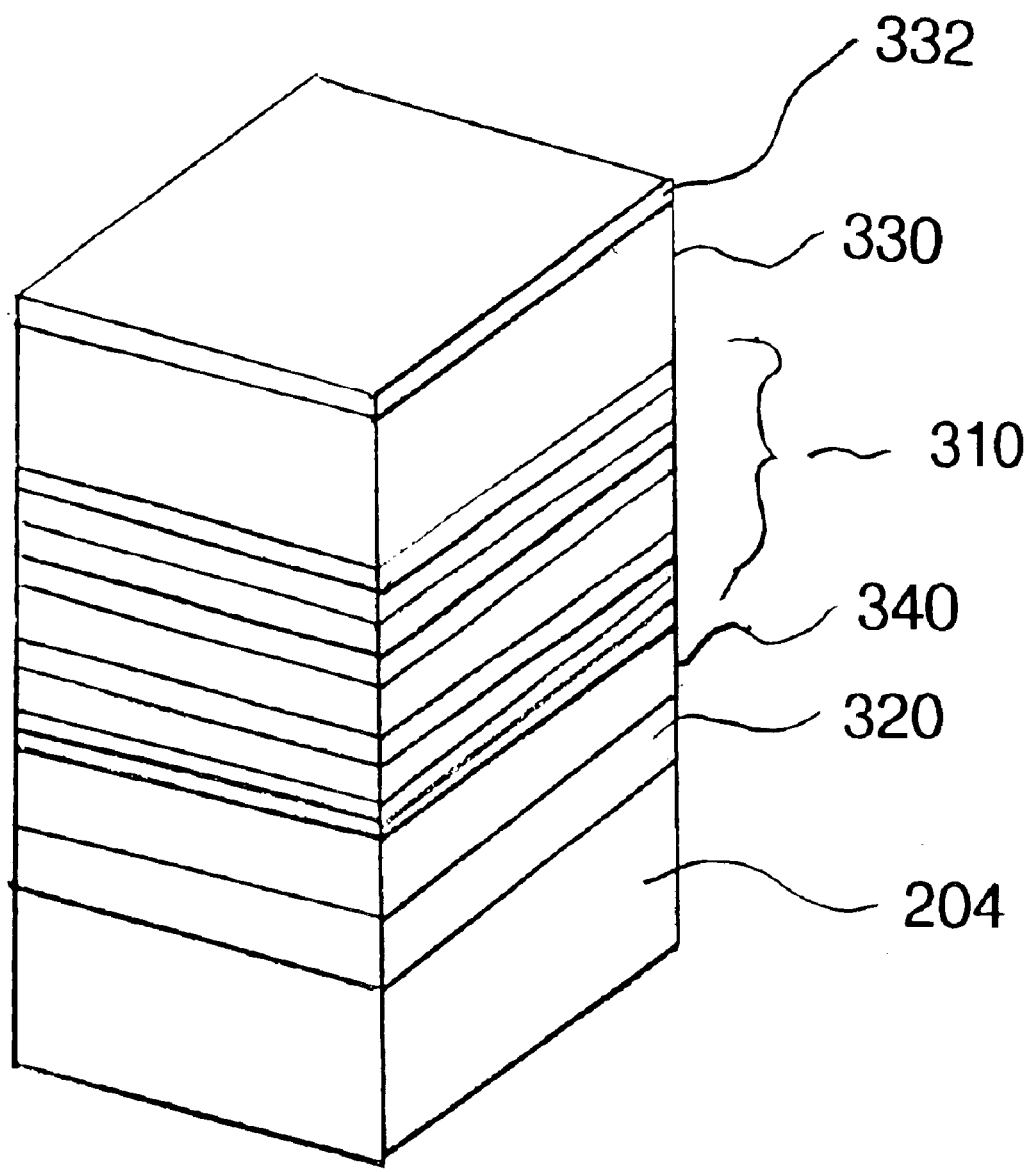
FIG. 3 is a partial cross sectional perspective view of a reflector in accordance with one embodiment of the present invention.

While the interference layers 310 provide high reflectivity for radiation in the target wavelength, another portion of the reflector absorbs radiation outside the target wavelength. Preferably, as shown in FIG. 3, an absorbing layer 320 is positioned above the reflector body surface 204 and below the interference layers 310. This absorbing layer 320 is more absorptive than the high reflectivity portion of the reflector 102. In the preferred embodiment, radiation passes through the interference layers 310 and is absorbed by the absorbing layer 320. The resultant heat passes through the reflector body 202 and is dissipated through the cooling mechanism described above.

Various materials may be employed for the absorbing layer 320 including, for example, metal oxides, and suitable materials will be apparent to those of skill in the art. Moreover, other mechanisms for absorption of radiation may also be employed within the scope of the present invention. For example, rather than employing an absorbing layer 320 as shown in FIG. 3, the reflector body surface 204 may absorb radiation that passes through the highly reflective portion of the reflector. Likewise, the structure of the interference layers 310 shown in FIG. 3 is merely exemplary; other mechanisms known in the art may be used to filter, mirror, or reflect radiation in the target wavelength range away from the absorbing portion of the reflector 102.

As shown in FIG. 3, a passivation layer 332 may be employed above the interference layers 310. This passivation layer prevents the material of the layers above the reflecting body surface 204 from possibly contaminating the RTP chamber. The passivation layer 332 may be made of silicon dioxide, aluminum oxide, silicon nitride, or any other acceptable material that will passivate the reflector without unacceptably degrading its reflective properties in the wavelength range of interest.

Further, other layers 330, 340 may be employed on the reflector surface 204 within the scope of the present invention to perform well-known functions for the fabrication or operation of the device. For example, such layers 330, 340 may be employed to facilitate application of, or transition between, the absorbing layer 320, the interference layers 310, and/or the passivation layer 332.

The target wavelength range of the radiation to be reflected depends on other factors such as the specific process and the substrate material. Generally, the target wavelength range corresponds to the spectral region that is used for the pyrometric temperature measurement. In the preferred embodiment, the pyrometric temperature measurement is an optical measurement of the radiation emitted by the substrate within a narrow spectral region. This spectral region is preferably approximately between 700 and 1000 nanometers.

Similarly, the wavelength of radiation to be absorbed can also be identified. The spectrum of the radiated energy from a substrate during thermal processing is a complicated function of temperature, emissivity, and Planck's blackbody law. In simplified terms, the spectral limits of the absorbing portion of the reflector are determined by the blackbody law and the temperature range of the peak temperature of the process, i.e., the temperature of the process where radiative cooling is most desired. In the preferred embodiment, that range is typically between 1000 and 1150 degrees Celsius. To capture 90% of the radiated energy of a substrate, the absorber spectral limits are approximately 1.2 to 8 microns, with the peak radiation occurring near 2.2 and 2.3 microns.

Figure 4:
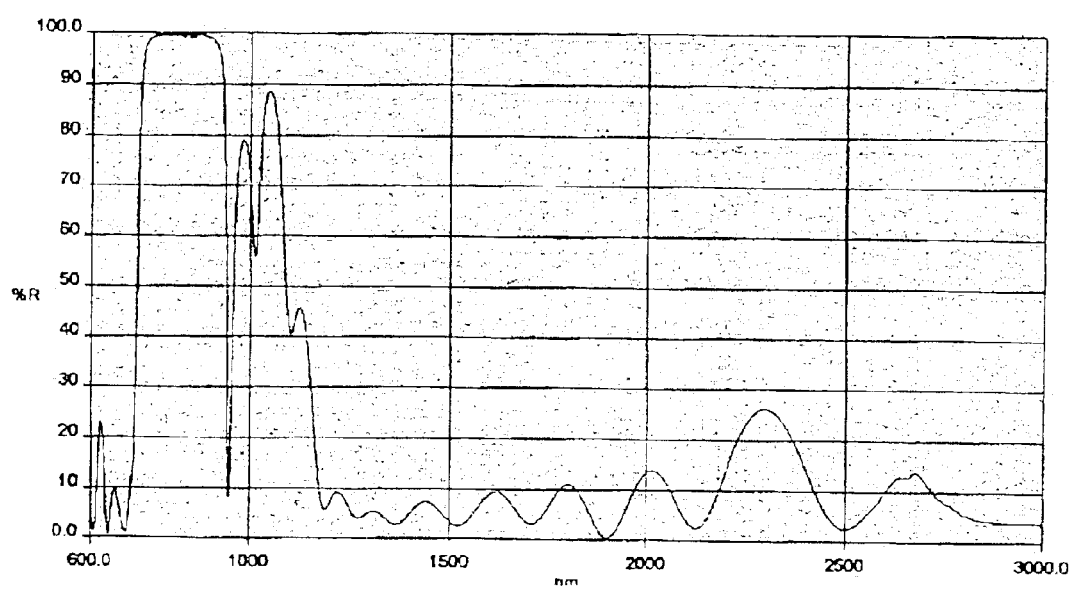
FIG. 4 is a plot of reflectivity versus wavelength for the reflector in accordance with one embodiment of the present invention.

FIG. 4 shows the reflectivity of the reflector 102 in accordance with one embodiment of the present invention. As shown therein, the interference layers 310, are preferably highly reflective of radiation having wavelength between 700 nanometers and 1000 nanometers. Preferably, the reflectivity of the interference layers 310 is close to unity for radiation in that target range. As shown in the figure, the reflectivity of the reflector 102 is preferably less than 0.3 for wavelengths below the target wavelength range, and is less than 0.3 for radiation having wavelength between 1200 nanometers and 10 microns. The reflectivity shown in FIG. 4 corresponds the a preferred embodiment of the present invention, but other levels of reflection and absorption across the spectrum of radiation wavelength may also be employed within the scope of the present invention. For example, a reflector having reflectivity in the wavelength range between 1000 and 1200 nanometers, as well as the range between 2100 and 2400 nanometers, lower than the reflectivity shown for those ranges in FIG. 4 could be employed within the scope the present invention.

Of course, the exact reflectivity of the highly reflective and absorptive portions of the reflector 102 is selected depending on the requirements of the particular process and substrate, as is the transparency of the interference layers 310 to radiation outside the target wavelength range. In this respect, the reflective portion need not be absolutely transparent to radiation outside the target wavelength. Rather, the specific transparency may be selected according to the particular process, and may vary for different wavelengths of radiation.

Figure 5:
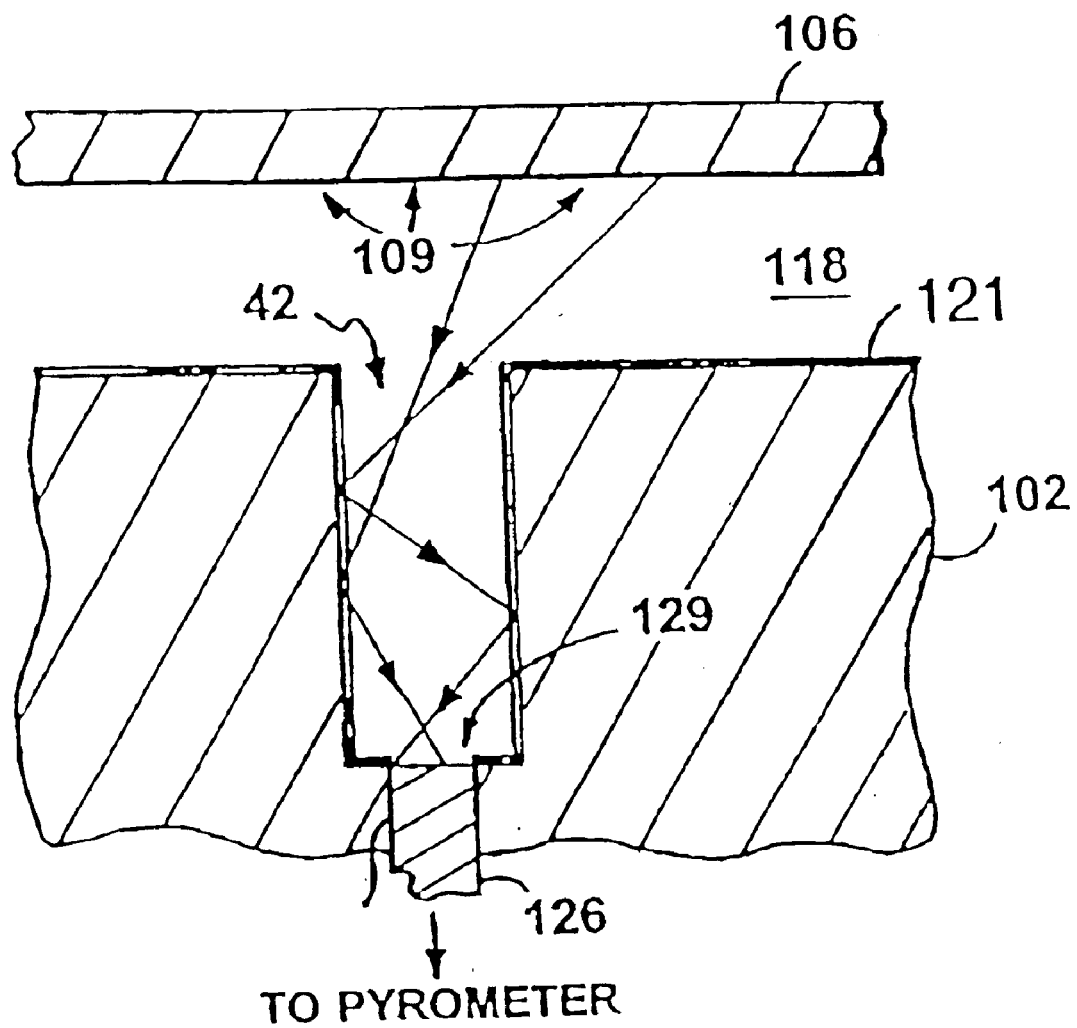
FIG. 5 is a partial cross-sectional side view of a reflective cavity in a reflector positioned near a substrate, in accordance with one aspect of the present invention.

FIG. 5 shows a portion of the reflector 102 in accordance with a preferred embodiment of the present invention. As shown in FIGS. 1, 2 and 5, a small reflective cavity 42 (i.e., a microcavity) is formed in the top surface of reflector 102 where the conduit passes through to the top of the reflector. The conduit enters the small cavity forming an aperture 129 at the bottom of the small cavity. Sapphire light pipe 126 is positioned within conduit 124 so that its uppermost end is flush with or slightly below the bottom of microcavity 42. The other end of light pipe 126 couples to a flexible optical fiber 125 that transmits sampled light from the cavity to a pyrometer 128.

The microcavity 42 functions to enhance the virtual blackbody effect of the reflecting cavity 118 that is present between the backside of the substrate 106 and the top of the reflector 102, thereby increasing the effective emissivity of the substrate to a value that is even closer to one. The cylindrical microcavity increases both the signal-to-noise ratio of the sampled signal that is detected by the light pipe and the effective emissivity of the substrate (or equivalently, the effective reflectivity of the reflecting cavity). The enhancement effect does not appear to be strongly dependent on whether the probe end is flush with the bottom of the surface microcavity 42 or is placed below that point and recessed within the conduit 124. Thus, the operation of inserting the probe into the conduit during the assembly of the reflector is made easier by not having to satisfy close critical tolerances regarding the placement of the probe end. However, the probe end preferably should not protrude into the surface microcavity since this seems to degrade the enhancement effect.

Assuming perfectly reflecting sidewalls in the cylindrical microcavity, the enhancement effect caused by the cylindrical microcavity increases as the L/R ratio of the microcavity increases. However, since the sidewalls are not perfectly reflecting, the more times the collected radiation reflects back and forth within the cavity, the more its signal strength will be diminished by the losses which occur upon each reflection. Therefore, as a practical matter there is a limit to how large one can make the L/R aspect ratio of the cylindrical microcavity and still obtain improvements in performance.

The surface microcavity 42, which is formed around the end of the probe, appears to work by increasing the level of self-irradiation of a localized region of the substrate backside, by increasing the collection efficiency of the probe, or by a combination of both mechanisms. In other words, the surface cavities increase, relative to a planar reflector, the amount of light that reflects from the reflector back at the localized region 109 on the substrate where the temperature is to be measured. This also increases the probe's collection of radiation.

Various configurations may be employed for the temperature probe 150 and corresponding microcavities 42 of the reflector 102. In one configuration, the effective emissivity for the temperature measurement probe 150 of FIG. 1 may be larger than the effective emissivity for the correction probe 152. Alternatively to placing probe 52 closer to the backside of substrate 106, it could be placed in a cylindrical microcavity which has its bottom covered with a non-reflecting material. In some embodiments, it is desirable that the two probes yield different effective emissivities. In some embodiments, it is preferable that the two selected probe geometries produce a difference in associated effective emissivities that is maximized. In other embodiments, the two probes could be connected to the same recess.

In the described embodiment, probes 150, 152 are spaced-apart by sufficient distance so that the hole producing the lower effective emissivity does not interfere with or degrade the effective reflectivity of the other probe. However, the two probes should not be spaced so far apart that they do not measure the temperature of roughly the same region of the substrate. For the described embodiment, a typical separation which appears to meet these requirements is between 1 to 3 cm. If the substrate rotates, this means that the radii at which the two probes are located should differ by no more than this amount.

Radiation emitted from the substrate 106 is therefore transmitted to one or more pyrometers 128, as shown in FIG. 1. The substrate temperature corresponding to the radiation received at each pyrometer is then calculated using known techniques, such as those described in U.S. Pat. No. 5,660, 472. According to one method described therein, two or more probes may be calibrated using a special calibration substrate of known emissivity. Generally, the effective reflectivity of the probes is determined from this calibration. Using that effective reflectivity and known plots of effective emissivity versus emissivity for certain effective reflectivities, the actual emissivity for the substrate 106 may be determined. Knowing the effective emissivity of the substrate 106, the corrected temperature of the substrate, based on the radiation received by the pyrometers, can be determined.

Those skilled in the art to which the invention pertains may make modifications and other embodiments employing the principles of this invention without departing from its spirit or essential characteristics particularly upon considering the foregoing teachings. The described embodiments are to be considered in all respects only as illustrative and not restrictive and the scope of the invention is, therefore, indicated by the appended claims rather than by the foregoing description Consequently, while the invention has been described with reference to particular embodiments, modifications of structure,-sequence, materials and the like will be apparent to those skilled in the art, yet still fall within the scope of the invention.

What is claimed is:

1. An apparatus for thermally processing a substrate comprising:

a chamber;

a support for mounting a substrate in the chamber;

a heating element positioned to heat the substrate when it is mounted on the support;

a liquid-cooled reflecting body positioned in the chamber and facing the substrate when the substrate is mounted on the support; and a pyrometer positioned to receive radiation emitted by the substrate and received on the reflecting body, said pyrometer configured to measure the intensity of radiation in a target wavelength range;

wherein said reflecting body includes a first area having a high reflectivity for radiation in the target wavelength range and a low reflectivity for radiation outside the target wavelength range and comprising (i) an upper portion highly reflective in the target wavelength range, and (ii) a lower portion of an absorptive layer underlying said upper portion and formed over said reflective body.

2. The apparatus of claim 1, wherein said high reflectivity is reflectivity greater than 0.95.

3. The apparatus of claim 1, wherein said low reflectivity is less than 0.50.

4. The apparatus of claim 1, wherein said upper portion is transparent to radiation outside the target wavelength range.

5. The apparatus of claim 1, wherein said lower portion comprises a metal oxide.

6. The apparatus of claim 1, wherein said upper portion comprises one or more interference coating layers.

7. The apparatus of claim 1, wherein said target wavelength range in between 700 and 1000 nanometers.

8. The apparatus of claim 1, wherein said target wavelength range is between 800 and 900 nanometers.

9. An apparatus for thermally processing a substrate comprising:

a chamber;

a support for mounting a substrate in the chamber;

a heating element positioned to heat the substrate when it is mounted on the support;

a reflecting body positioned in the chamber and facing the substrate when the substrate is mounted on the support, said reflecting body comprising an absorptive portion a reflective portion overlying said absorptive portion, wherein said reflective portion is highly reflective of radiation in a target wavelength range, wherein said reflecting body has a reflectivity of greater than 0.99 for radiation having wavelength between 700 and 1000 nanometers and has a reflectivity of less than 0.30 for radiation having wavelength greater than 1200 nanometers.

10. The apparatus of claim 9, wherein said reflective portion is transparent of radiation outside the target wavelength range.

11. The apparatus of claim 9, wherein the target wavelength range is between 700 and 1000 nanometers.

12. The apparatus of claim 9, wherein the reflectivity of the reflecting body is less than 0.30 for radiation having wavelength less than 650 nanometers.

13. The apparatus of claim 9, wherein the reflectivity of the reflecting body is less than 0.90 for radiation having wavelength greater than 1000 nanometers.

14. The apparatus of claim 9, wherein the absorptive portion comprises one or more coatings over a base material of the reflective body.

15. The apparatus of claim 9, wherein the reflective portion comprises one or more interference layers of material.

16. The apparatus of claim 9, further comprising:

a pyrometer positioned to measure the intensity of radiation emitted by the substrate and received on the reflecting body, said pyrometer configured to be highly sensitive to radiation in the target wavelength range.

17. An apparatus for thermally processing a substrate comprising:

a heating element positioned to heat the substrate;

a cooling body positioned to receive radiation emitted by the substrate;

said cooling body comprising a body portion, an absorbing layer overlying the body portion, and one or more reflective layers overlying the absorbing layer.

18. A reflector for rapid thermal processing of a substrate, comprising:

at least one pyrometer measuring radiation having a wavelength within a target wavelength range;

an absorptive layer having a reflectivity of less than 0.5 for radiation outside the target wavelength range;

a reflective layer overlying said absorptive layer, said reflective layer having high reflectivity of radiation received on the surface of the reflector in the target wavelength range and reduced reflectivity of radiation outside the target wavelength range;

one or more conduits formed through said absorptive and reflective layers and configured to convey radiation reflected by said reflective layer to one or more pyrometers.

19. The reflector of claim 18, wherein said target wavelength range is between 700 and 1000 nanometers.

20. The reflector of claim 18, wherein said reflective portion has a reflectivity of greater than 0.99 for radiation outside the target wavelength range.

21. A reflector for rapid thermal processing of a substrate, comprising:

a body portion;

a coating overlying the body portion, said coating comprising a reflective portion overlying an absorptive portion.

22. The reflector of claim 21, said reflective portion comprising one or more interference layers of material.

23. The reflector of claim 21, said absorptive portion comprising one or more layers of absorptive material.

24. The apparatus of claim 1, wherein said reflecting body comprises a metal body coated with said upper and lower portions.

25. The apparatus of claim 3, wherein said low reflectivity is less than 0.50 in a wavelength range of 1.2 to 8 microns.

26. In a rapid thermal processing chamber having radiant lamps for heating a substrate, a reflector disposed on a back side of said substrate opposite said lamp comprising:

a metal base member having liquid cooling passages associated therewith;

an absorptive layer formed on a side of said base member facing said back side of substrate; and an interference mirror formed on said absorptive layer reflecting light within a wavelength band toward said back side of said substrate.

27. The reflector of claim 26, further comprising at least one pyrometer directed at said back side of said substrate and responsive to radiation within said wavelength band to measure a temperature of said substrate.

* * * * *